(12) United States Patent
Ishida et al.

(10) Patent No.: US 7,064,359 B2
(45) Date of Patent: Jun. 20, 2006

(54) SWITCHING SEMICONDUCTOR DEVICE AND SWITCHING CIRCUIT

(75) Inventors: Hidetoshi Ishida, Kyoto (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 11 days.

(21) Appl. No.: 10/912,567

(22) Filed: Aug. 6, 2004

(65) Prior Publication Data

US 2005/0051793 A1 Mar. 10, 2005

(30) Foreign Application Priority Data

Aug. 20, 2003 (JP) ............................. 2003-296060

(51) Int. Cl.
| H01L 31/0328 | (2006.01) |
| H01L 31/0336 | (2006.01) |
| H01L 31/072  | (2006.01) |
| H01L 31/109  | (2006.01) |

(52) U.S. Cl. ................. 257/192; 257/11; 257/24; 257/27; 257/130; 257/131; 257/143; 257/149; 257/151; 257/153; 257/154; 257/155; 257/160; 257/161; 257/194; 257/195; 257/918

(58) Field of Classification Search ........ 257/130–131, 257/143, 149, 151, 153–155, 918, 11, 24, 257/27, 192, 194–195, 160–161

See application file for complete search history.

(56) References Cited

U.S. PATENT DOCUMENTS 4,481,521 A * 11/1984 Okumura .................. 257/360
2002/0052076 A1 * 5/2002 Khan et al. ................ 438/235
2002/0121647 A1 * 9/2002 Taylor ........................ 257/192
2003/0020091 A1 * 1/2003 Tungare et al. ............. 257/190
2003/0034545 A1 * 2/2003 Johnson et al. ............. 257/526
2003/0036213 A1 * 2/2003 Brophy ....................... 438/31
2004/0070003 A1 * 4/2004 Gaska et al. ................ 257/192
2004/0150043 A1 * 8/2004 Holm et al. ................. 257/347
2004/0173816 A1 * 9/2004 Saxler ........................ 257/195
2005/0167775 A1 * 8/2005 Nagy et al. ................. 257/500

FOREIGN PATENT DOCUMENTS

JP 9-246471 9/1997

OTHER PUBLICATIONS

Miyatsuji, Kazuo., et al. "A GaAs High Power RF Single Pole Dual Throw Switch IC for Digital Mobile Communication System." IEEE Journal of Solid State Circuits, vol. 30, No. 9, Sep. 1995, pp. 979-983.

* cited by examiner

Primary Examiner—Ida M. Soward
(74) Attorney, Agent, or Firm—McDermott Will & Emery LLP

(57) ABSTRACT

A switching semiconductor device includes a first compound layer formed on a single crystal substrate which includes silicon carbide or sapphire, and including a general formula $In_xGa_{1-x}N$, where $0 \leq x \leq 1$; a second compound layer formed on the first compound layer, and including a general formula $In_yAl_zGa_{1-y-z}N$, where $0 \leq y \leq 1$ and $0 < z \leq 1$; and a gate electrode formed on the second compound layer. The gate electrode is electrically connected to a resistance element formed on a first interlayer insulating film that covers the gate electrode, through a metal wiring formed on a second interlayer insulating film that covers the first interlayer insulating film.

24 Claims, 17 Drawing Sheets

$$V_b/(I_{max} \cdot Z_o) \leqq W_{g1}, W_{g2} \leqq 1/(2\pi \cdot f \cdot C_{off} \cdot Z_o)$$

SWITCHING SEMICONDUCTOR DEVICE AND SWITCHING CIRCUIT

CROSS-REFERENCE

All the matters disclosed in the claims, the specification, and the drawings of Japanese Patent Application No. 2003-296060 filed on Aug. 20, 2003 are incorporated herein by reference.

BACKGROUND OF THE INVENTION

The present invention relates to a switching semiconductor device and a switching circuit employed in a radio-frequency communication apparatus such as a cellular telephone.

Recently, a high-frequency switching circuit which switches over a high-frequency signal transmitted or received through an antenna between a transmitter-side circuit and a receiver-side circuit has been widely employed in a mobile communication apparatus represented by a cellular telephone. Important electric characteristics of the high-frequency switching circuit are an insertion loss characteristic in an ON state and an isolation characteristic in an OFF state.

A gallium arsenide (GaAs)-based field-effect transistor (FET) manufactured on a substrate consisting of GaAs has been conventionally used so that the high-frequency switching circuit can exhibit both the insertion loss characteristic and the isolation characteristic. Even in an era in which GaAs is replaced by silicon (Si) or silicon germanium (SiGe) as a material for a high-frequency component of the mobile communication apparatus, GaAs-based compound semiconductor tends to be still used for the switching IC device.

FIG. 17 depicts a circuit configuration of a high-frequency switching circuit composed of conventional FETs (FET1 and FET2) and resistors (R1 and R2) provided between gates and control terminals (CTL1 and CTL2) of the FET1 and FET2, respectively (see, for example, K. Miyatsuji and D. Ueda, "A GaAs High Power RF single Pole Dual Throw Switch IC for Digital Mobile Communication System", IEEE Journal of Solid-state circuits, Vol. 30, No. 9, pp. 979–983, September 1995). If a voltage of 0 V is applied to the control terminal CTL1 of the FET1 and a voltage of −5 V is applied to the control terminal CTL2 of the FET2, the switching circuit turns into an ON state. Conversely, if a voltage of −5 V is applied to the control terminal CTL1 of the FET1 and a voltage of 0 V is applied to the control terminal CTL2 of the FET2, the switching circuit turns into an OFF state.

Device parameters, based on which the important electric characteristics, i.e., the insertion loss characteristic and the isolation characteristic of the switching circuit are determined, are an ON resistance $R_{on}$ which is a resistance between a drain and a source when each FET is in the ON state and an OFF capacitance $C_{off}$ which is a capacitance between the drain and the source when the FET is in the OFF state.

It is necessary to reduce the ON resistance $R_{on}$ so as to reduce an insertion loss in the ON state. In addition, it is necessary to reduce the OFF capacitance $C_{off}$ so as to improve the isolation characteristic in the OFF state.

However, there is a tradeoff relationship between the ON resistance $R_{on}$ and the OFF capacitance $C_{off}$. In other words, if a distance between the drain and the source of the FET is shortened so as to reduce the ON resistance $R_{on}$, the OFF capacity $C_{off}$ is contrarily increased, resulting in deterioration in the isolation characteristic.

SUMMARY OF THE INVENTION

Meanwhile, attention has been paid to an AlGaN/GaN heterojunction FET ("HFET") constituted by a heterojunction between a Group III–V nitride, e.g., aluminum gallium nitride (AlGaN) and gallium nitride (GaN), as a next-generation high-speed electronic device which replaces the GaAs-based HFET. The AlGaN/GaN HFET is expected not only as a high power device but also a low noise device. However, the AlGaN/GaN HFET has never been employed in a high-frequency switching circuit.

The present invention is intended to realize reduction of an ON resistance $R_{on}$ and a reduction of an OFF capacitance $C_{off}$ by employing a GaN-based HFET.

The HFET consisting of AlGaN or GaN is quite promising as a device employed in a high-frequency switching circuit for the following reasons. First, a high dielectric breakdown voltage of GaN can tremendously increase a switchable signal power. Normally, a signal power which can pass through the switching circuit is determined by an opposite-direction breakdown voltage and a threshold voltage $V_{th}$ of the HFET. A breakdown voltage of the GaN-based HFET is several times as high as that of the GaAs-based FET. It is, therefore, possible to switch high power signal.

Although the GaN-based HFET is quite promising as a high-frequency switching circuit device, the GaN-based HFET confronts the disadvantage of high ON resistance $R_{on}$.

Furthermore, it is necessary to reduce the OFF capacitance $C_{off}$ so as to improve the isolation characteristic of the GaN-based HFET to serve as the high-frequency switching circuit device, as already described.

Moreover, the characteristics of the switching circuit depend not only on the ON resistance $R_{on}$ and the OFF capacitance $C_{off}$ per unit gate width but also on a gate width of the FET. Unfortunately, a method for optimizing this gate width is not evident.

Objects of the present invention are to solve the disadvantages which occur when a GaN-based HFET is employed as a high-frequency switching circuit device, and to realize both a reduction of an ON resistance and a reduction of an OFF capacitance and to obtain an optimum design value for a gate width in a switching semiconductor device using a Group III–V nitride.

In order to achieve the above objects, the switching semiconductor device using a Group III–V nitride is constituted to use a material lower in dielectric constant than gallium arsenide for a substrate or to reduce an ohmic resistance.

According to one aspect of the present invention, there is provided a switching semiconductor device characterized by comprising: a first compound layer formed on a substrate, and consisting of a general formula $In_xGa_{1-x}N$, where $0 \leq x \leq 1$; a second compound layer formed on the first compound layer, and consisting of a general formula $In_yAl_zGa_{1-y-z}N$, where $0 \leq y \leq 1$ and $0 < z \leq 1$; a gate electrode formed on the second compound layer; and a resistor connected to the gate electrode.

The switching semiconductor device according to the present invention consists of the GaN-based compound. Since the GaN-based compound is lower in dielectric constant than the GaAs-based compound, the OFF capacitance $C_{off}$ can be reduced. In addition, since silicon carbide, sapphire, silicon, aluminum nitride, or the like lower in dielectric constant than the GaAs-based compound can be used for the substrate for epitaxial growth, the OFF capacitance $C_{off}$ can be further reduced. Since the GaN-based transistor is higher in two-dimensional electron density than the GaAs-based transistor, the ON resistance $R_{on}$ can be reduced.

It is preferable that the switching semiconductor device according to the present invention further comprises a third compound layer formed between the substrate and the first compound layer, and consisting of a general formula $Al_uGa_{1-u}N$, where $0<u\leq 1$. If the third compound layer consisting of $Al_uGa_{1-u}N$ is provided between the substrate and the first compound layer, the OFF capacitance $C_{off}$ can be further reduced thanks to the low dielectric constant of $Al_uGa_{1-u}N$.

It is preferable that the substrate consists of silicon carbide, sapphire, silicon, or aluminum nitride.

It is preferable that the switching semiconductor device according to the present invention further comprises an ohmic electrode formed on the second compound layer, and that a region of the second compound layer below the ohmic electrode is doped with n-type impurities. By doing so, the contact resistance between the second compound layer and the ohmic resistance is reduced, so that it is possible to ensure reducing the ON resistance $R_{on}$.

In this case, it is further preferable that an interface between the second semiconductor layer and the ohmic electrode and neighborhoods of the interface are doped with n-type impurities.

In this case, it is preferable that the n-type impurities are silicon impurities.

It is preferable that in the switching semiconductor device according to the present invention, if it is assumed that a gate width of the gate electrode is $W_g$, a drain-source capacitance per unit gate width of the gate electrode during channel cutoff is $C_{off}$, a maximum drain current per unit gate width is $I_{max}$, a breakdown voltage is $V_b$, a characteristic impedance of a system is $Z_0$, and an operating frequency is f, the gate width $W_g$ satisfies a relationship represented by: $V_b/(I_{max} \cdot Z_0) \leq W_g \leq 1/(2\pi \cdot f \cdot C_{off} \cdot Z_0)$. By doing so, the gate width of the transistor is set at a value which does not exceed the breakdown voltage from the left side of the above formula, and the relationship between the OFF capacitance $C_{off}$ and the characteristic impedance $Z_0$ is restricted from the right side of the formula. Besides, since the gate width is optimized, the high-frequency signal can be effectively transmitted. In addition, due to the low dielectric constant of the substrate, the OFF capacitance $C_{off}$ is reduced and, therefore, it is possible to reduce the insertion loss characteristic and improve the isolation characteristic.

It is preferable that in the switching semiconductor device according to the present invention, the gate electrode is composed of a single gate electrode, and that the switching semiconductor device further comprises a booster circuit which applies a boosted voltage, obtained by boosting a power supply voltage, to the gate electrode. By doing so, the number of stages of transistors can be reduced by the booster circuit. Besides, even with the single gate structure having a single gate, the RF signal with high input power can be switched.

It is preferable that in the switching semiconductor device according to the present invention, a gate insulating film is formed between the gate electrode and the second compound layer. If the gate electrode is so-called MIS type, high breakdown voltage can be realized.

According to another aspect of the present invention, there is provided a switching circuit comprising: a first transistor connected in series between an input terminal and an output terminal; and a second transistor shunt-connected to the first transistor, wherein the first transistor and the second transistor are formed on a same substrate, each of the first transistor and the second transistor comprises: a first compound layer formed on a substrate, and consisting of a general formula $In_xGa_{1-x}N$, where $0 \leq x \leq 1$; a second compound layer formed on the first compound layer, and consisting of a general formula $In_yAl_zGa_{1-y-z}N$, where $0 \leq y \leq 1$ and $0 < z \leq 1$; a gate electrode formed on the second compound layer; and a resistor connected to the gate electrode.

According to the present invention, the switching circuit including a shunt electric path (branch path) can be constituted using a pair of switching semiconductor devices according to the present invention.

It is preferable that the switching circuit according to the present invention further comprises a first switching circuit and a second switching circuit including the first transistor and the second transistor, respectively, and that the first transistor in the first switching circuit and the first transistor in the second switching circuit are connected in series. By doing so, a single pole double throw ("SPDT") type switching circuit suited as a high-frequency switching circuit in a mobile communication apparatus can be constituted.

It is preferable that the switching circuit according to the present invention further comprises a third compound layer formed between the substrate and each the first compound layer, and consisting of a general formula $Al_uGa_{1-u}N$, where $0<u\leq 1$.

It is preferable that in the switching circuit according to the present invention, the substrate consists of silicon carbide, sapphire, silicon, or aluminum nitride.

It is preferable that in the switching circuit according to the present invention, each of the first transistor and the second transistor comprises an ohmic electrode formed on the second compound layer, and that a region of the second compound layer below the ohmic electrode is doped with n-type impurities.

In this case, it is preferable that an interface between the second compound layer and the ohmic electrode and neighborhoods of the interface are doped with n-type impurities.

In this case, it is preferable that the n-type impurities are silicon impurities.

It is preferable that in the switching circuit according to the present invention, if it is assumed that a gate width of the gate electrode is $W_g$, a drain-source capacitance per unit gate width of the gate electrode during channel cutoff is $C_{off}$, a maximum drain current per unit gate width is $I_{max}$, a breakdown voltage is $V_b$, a characteristic impedance of a system is $Z_0$, and an operating frequency is f, the gate width $W_g$ satisfies a relationship represented by $V_b/(I_{max} \cdot Z_0) \leq W_g \leq 1/(2\pi \cdot f \cdot C_{off} \cdot Z_0)$.

It is preferable that in the switching circuit according to the present invention, a gate width of the gate electrode in the first transistor is larger than 1.0 mm and smaller than 3.0 mm, and that a gate width of the gate electrode in the second transistor is larger than 0 mm and smaller than 2.0 mm.

It is preferable that in the switching circuit according to the present invention, each the gate electrode is composed of a single gate electrode, and that the switching circuit further comprises a booster circuit which applies a boosted voltage, obtained by boosting a power supply voltage, to each the gate electrode.

It is preferable that in the switching circuit according to the present invention, a gate insulating film is formed between each the gate electrode and each the second compound layer.

In this case, it is preferable that the gate insulating film consists of gallium oxide, aluminum oxide, or aluminum nitride.

BRIEF DESCRIPTION OF THE DRAWINGS

FIGS. 6A and 6B depict a switching circuit according to a second embodiment of the present invention, wherein FIG. 6A is a circuit diagram and FIG. 6B is an equivalent circuit of FIG. 6A.

FIGS. 8A and 8b depict a switching circuit according to a third embodiment of the present invention, wherein FIG. 8A is a circuit diagram and FIG. 8B is an equivalent circuit of FIG. 8A.

FIGS. 13A and 13B are graphs which depict dependency of electric characteristics of the switching semiconductor device that constitutes the switching circuit according to the third embodiment of the present invention, on gate widths, wherein FIG. 13A depicts an insertion loss characteristic and FIG. 13B depicts an isolation characteristic.

DETAILED DESCRIPTION OF THE INVENTION

Embodiment 1

A first embodiment of the present invention will be described with reference to the drawings.

Figure 1:
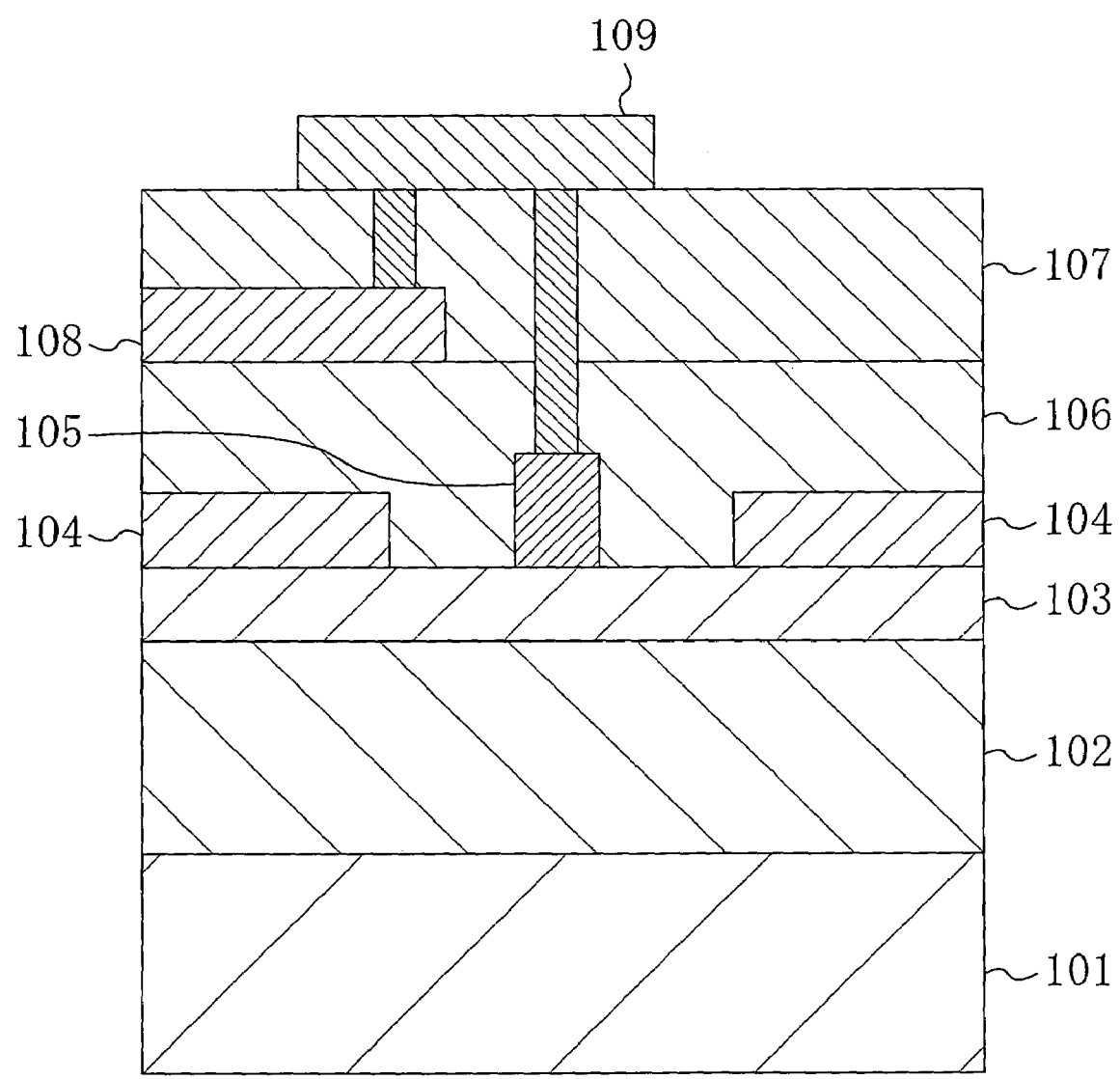
FIG. 1 is a sectional block diagram which depicts a switching semiconductor device (HFET) according to a first embodiment of the present invention.

FIG. 1 depicts a sectional configuration of a switching semiconductor device according to a first embodiment of the present invention. As shown in FIG. 1, a heterojunction field-effect transistor (HFET) which serves as the switching semiconductor device according to the first embodiment includes a first compound layer 102 and a second compound layer 103 which are sequentially formed on a single crystal substrate 101 consisting of high-resistance silicon carbide (SiC) by epitaxial growth. The first compound layer 102 consists of undoped $In_xGa_{1-x}N$ (where $0 \leq x \leq 1$) and has a thickness of about 3 μm, and the second compound layer 103 consists of undoped $In_yAl_zGa_{1-y-z}N$ (where $0 \leq y \leq 1$ and $0 < z \leq 1$).

The first compound layer 102 and the second compound layer 103 each having a heterojunction surface form a so-called modulation dope structure in which charges are supplied by a polarization effect (spontaneous polarization, that is, piezo polarization) characteristic of a GaN-based compound. A high-concentration two-dimensional electron gas ("2DEG") is accumulated in the first compound layer 102 near an interface between the first compound layer 102 and the second compound layer 103. The second compound layer 103 may be doped with n-type impurities so as to improve carrier supply efficiency. However, it is preferable that the second compound layer 103 is undoped if the semiconductor device is used as a semiconductor device which is required to be high in breakdown voltage.

Two ohmic electrodes 104, which are a source electrode and a drain electrode, respectively, and each of which is composed of a multilayer body of, for example, titanium (Ti) and aluminum (Al), are formed on an upper surface of the second compound layer 103 so as to be distant from each other. In addition, in a region between the ohmic electrodes 104 on the upper surface of the second compound layer 103, a Schottky gate electrode 105 consisting of palladium silicide (PdSi) is formed.

A first interlayer insulating film 106 which covers the respective ohmic electrodes 104 and the gate electrode 105, an upper surface of which is flattened, and which consists of silicon nitride (SiN) or silicon oxide ($SiO_2$) is formed on the upper surface of the second compound layer 103.

A resistance element 108 which consists of an alloy of nickel (Ni) and chromium (Cr) or tungsten silicon nitride (WSiN) is formed on the first interlayer insulating film 106.

A second interlayer insulating film 107 which covers the resistance element 108 and an upper surface of which is flattened is formed on the upper surface of the first interlayer insulating film 106. A wiring 109 consisting of metal such as gold (Au), copper (Cu), or aluminum (Al) is formed on the second interlayer insulating film 107. A first contact hole which exposes the gate electrode 105 is formed in the first interlayer insulating film 106 and the second interlayer insulating film 107. A second contact hole which exposes the resistance element 108 is formed in the second interlayer insulating film 107. The first and the second contact holes are filled with the metal that constitutes the wiring 109 or the other conductive member, and electrically connected to the gate electrode 105 and the resistance element 108 through the wiring 109, respectively.

As can be understood, according to the first embodiment, the first compound layer 102 and the second compound layer 103 are lower in dielectric constant than the GaAs-based compound. Therefore, an OFF capacitance $C_{off}$ of the GaN-based HFET can be reduced. Besides, high-resistance silicon carbide (SiC) that is employed for the single crystal substrate 101 is lower in dielectric constant than GaAs. Therefore, the OFF capacitance $C_{off}$ can be further reduced.

Furthermore, the GaN-based HFET is higher in two-dimensional electron density than the GaAs-based HFET. Therefore, if the switching circuit is constituted by the HFETs according to the first embodiment, an insertion loss of the switching circuit can be reduced while improving an isolation characteristic thereof.

In this first embodiment, the high-resistance silicon carbide (SiC) is used for the single crystal substrate 101. However, the present invention is not limited to this and sapphire (singe crystal $Al_2O_3$), aluminum nitride (AlN), or high-resistance silicon (Si) can be used for the single crystal substrate 101. The aluminum nitride is the lowest in dielectric constant among the silicon carbide, sapphire, and silicon.

Figure 2:
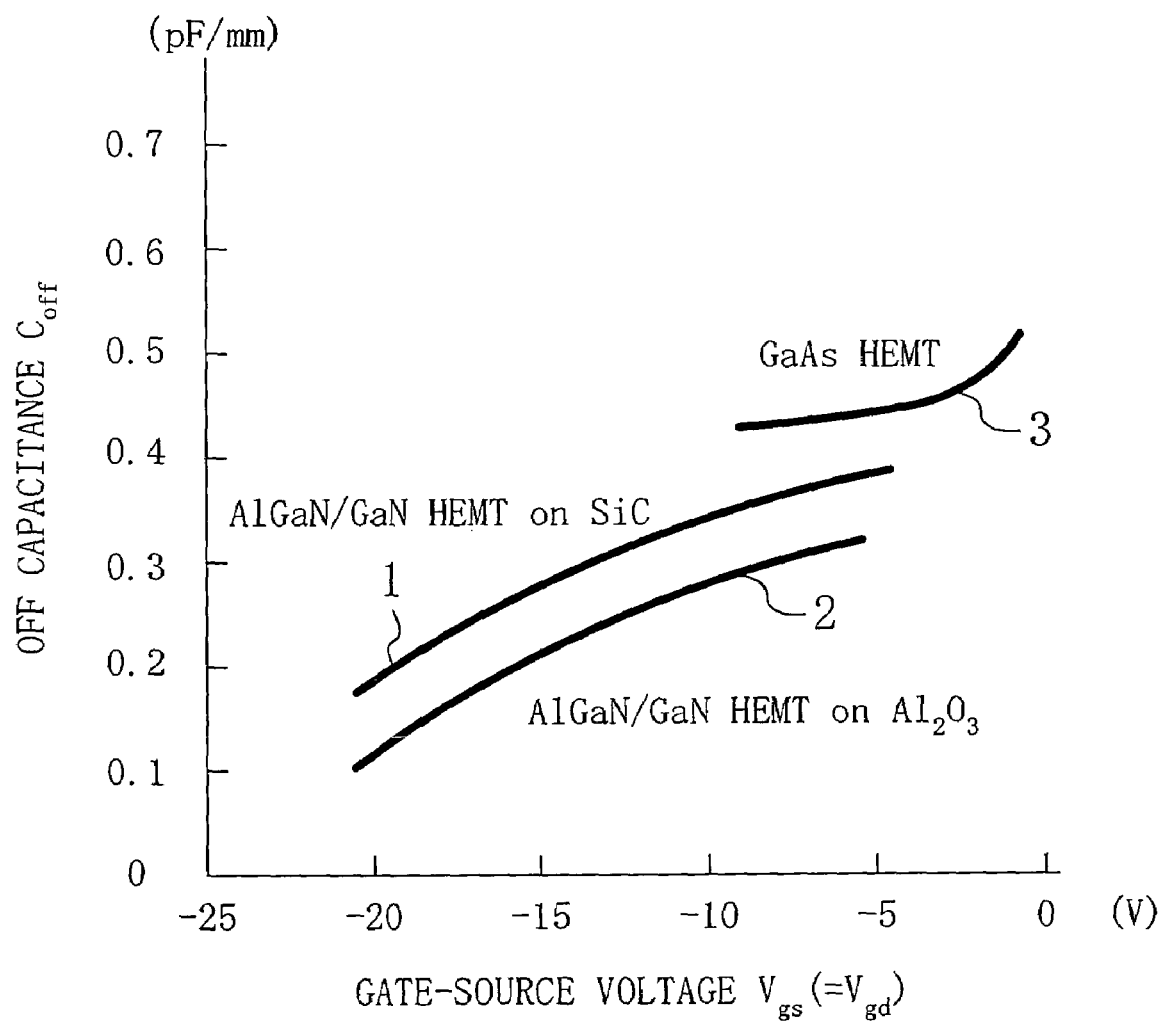
FIG. 2 is a graph which depicts dependency of an OFF capacitance f switching semiconductor device according to the first embodiment of the present invention, on a bias when silicon nitride or sapphire is used for a single crystal substrate, in comparison to a GaAs-based HFET.

FIG. 2 is a graph which depicts relationships between a gate-source voltage $V_{gs}$ and the OFF capacitance $C_{off}$ when silicon carbide (SiC) and sapphire (single crystal $Al_2O_3$) are used for the single crystal substrate 101, respectively, in comparison to the relationship therebetween of a GaAs-based HFET. In FIG. 2, the GaN-based HFET on the silicon carbide substrate according to the first embodiment is denoted by a curve 1, the GaN-based HFET on a sapphire substrate is denoted by a curve 2, and the conventional GaAs-based HFET is denoted by a curve 3. As shown in FIG. 2, the OFF capacitance $C_{off}$ of the GaN-based HFET is reduced greatly as compared with the conventional GaAs-based HFET. The OFF capacitance $C_{off}$ of the GaN-based FET using sapphire shown in the curve 2 is conspicuously reduced. Further, since sapphire is less expensive than silicon carbide, the cost of the GaN-based HFET can be reduced and the electric characteristics thereof can be considerably improved.

Conventionally, the GaN-based HFET has been studied so as to apply the GaN-based HFET as a high power amplifier device. Due to this, the silicon carbide having a high thermal conductivity is essential to the substrate for the epitaxial growth. However, basically no power is consumed in the switching circuit whether the switching circuit is in the ON state or in the OFF state. Therefore, the sapphire having a low thermal conductivity can be used.

Modification 1 of Embodiment 1

A first modification of the first embodiment according to the present invention will be described with reference to the drawings.

Figure 3:
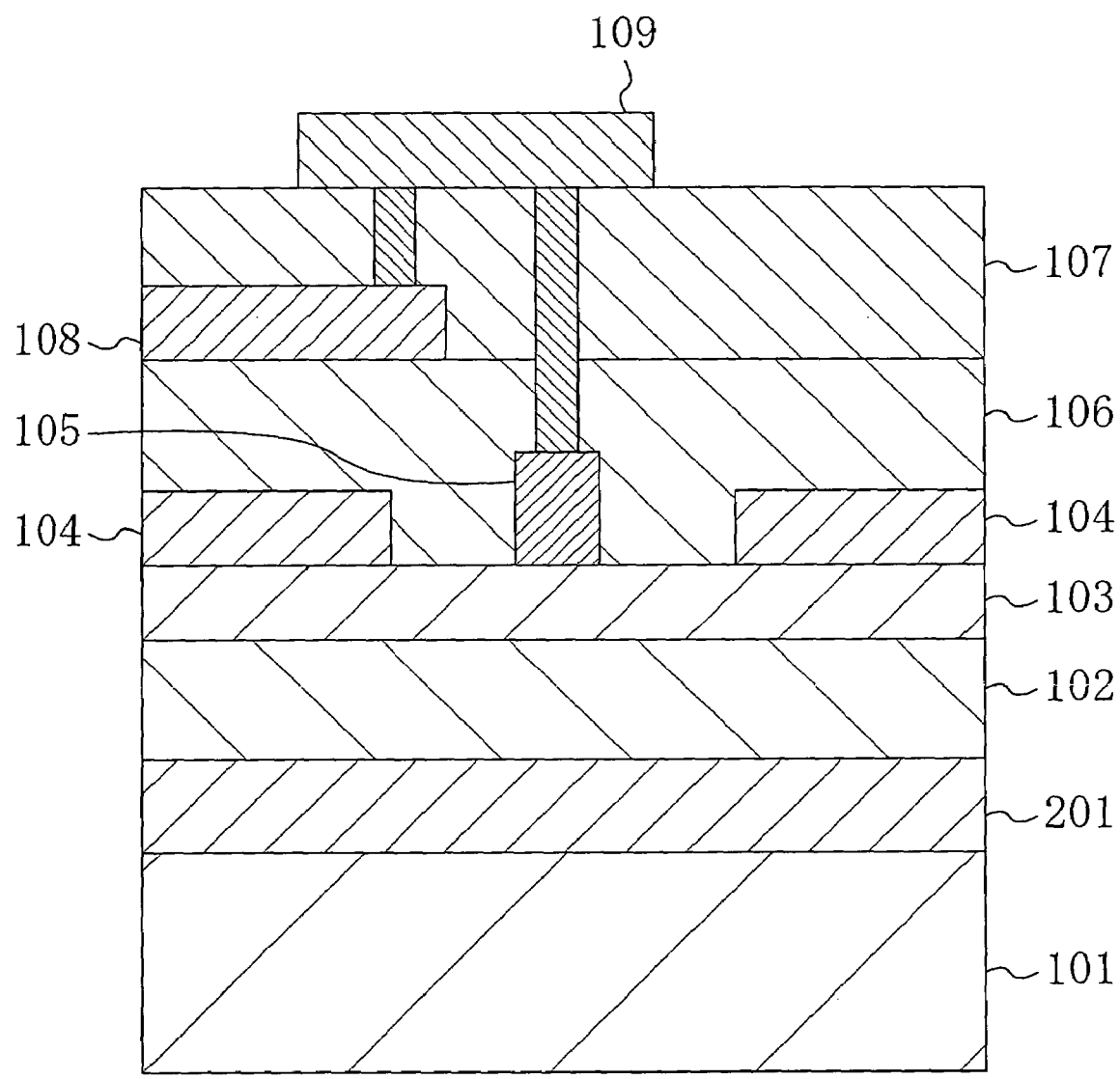
FIG. 3 is a sectional block diagram which depicts a switching semiconductor device according to a first modification of the first embodiment of the present invention.

FIG. 3 depicts a sectional configuration of a switching semiconductor device according to the first modification of the first embodiment of the present invention. In FIG. 3, the same constituent elements as those shown in FIG. 1 are denoted by the same reference numerals, and will not be described herein.

As shown in FIG. 3, the switching semiconductor device according to the first modification includes a third compound layer 201 which consists of undoped $Al_uGa_{1-u}N$ (where $0<u\leq1$) between a single crystal substrate 101 which consists of silicon carbide and a first compound layer 102, and which has a thickness of about 1 μm.

As already described, $Al_uGa_{1-u}N$ is lower in dielectric constant than silicon carbide. Therefore, the OFF capacitance $C_{off}$ of the switching semiconductor device can be further reduced and the isolation characteristic thereof can be further improved, accordingly.

If aluminum nitride is used for the single crystal substrate 101, the third compound layer 201 consisting of $Al_uGa_{1-u}N$ is not always provided.

Figure 4:
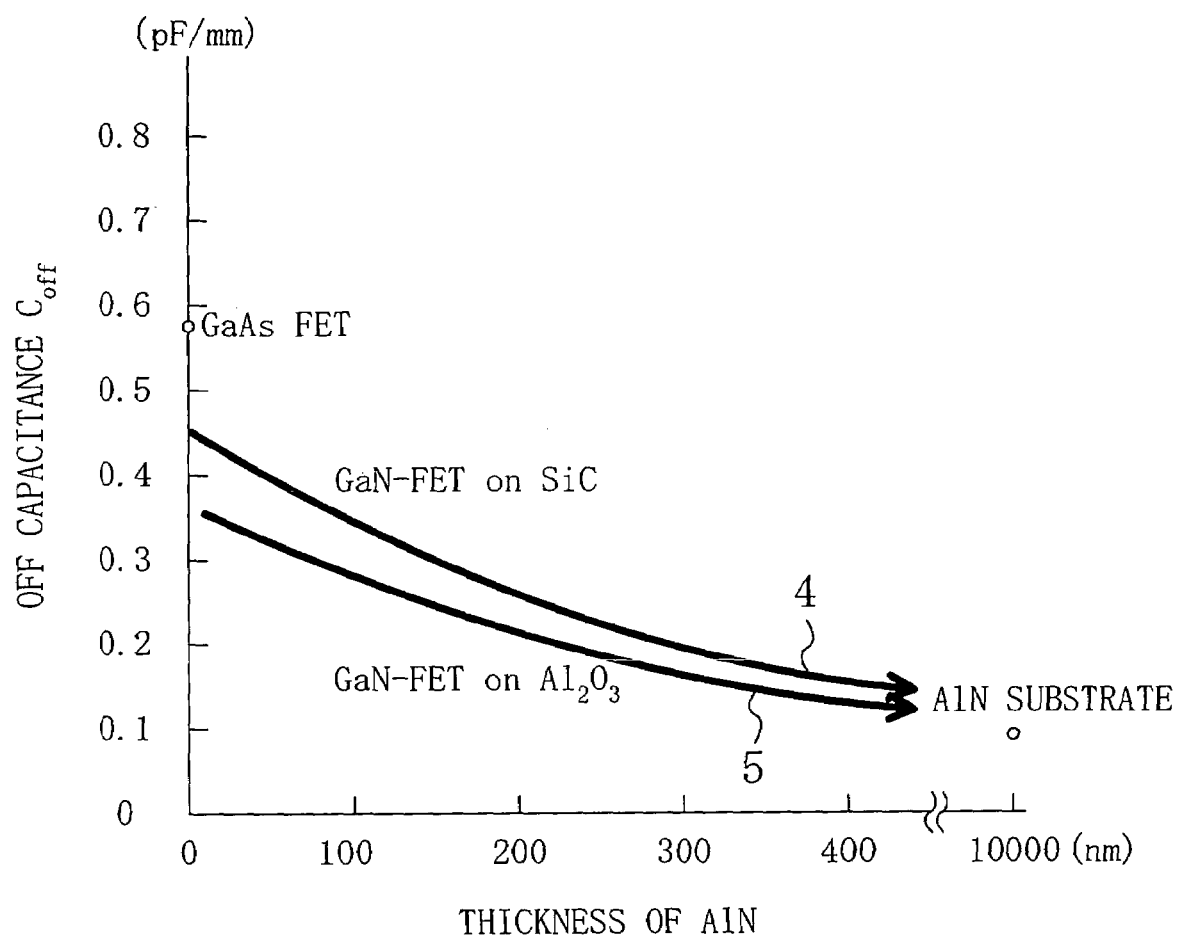
FIG. 4 is a graph which depicts dependency of an OFF capacitance of the switching semiconductor device according to the first modification of the first embodiment of the present invention, on a thickness of an aluminum layer when silicon nitride or sapphire is used for a single crystal substrate, in comparison to the GaAs-based HFET.

FIG. 4 is a graph which depicts relationships between a thickness of the third compound layer 201 and the OFF capacitance $C_{off}$ when silicon carbide (SiC) and sapphire (single crystal $Al_2O_3$) are used for the single crystal substrate 101, respectively, in comparison to the relationship therebetween of the GaAs-based HFET. It is assumed herein that the third compound layer 201 consists of aluminum nitride (AlN). In FIG. 4, the GaN-based HFET on the silicon carbide substrate according to the first modification is denoted by a curve 4, and the GaN-based HFET on a sapphire substrate is denoted by a curve 5. As shown in FIG. 4, the OFF capacitance $C_{off}$ of the GaN-based HFET is reduced greatly as the thickness of the aluminum nitride layer is increased, whether silicon carbide or sapphire is used for the substrate.

Modification 2 of Embodiment 1

A second modification of the first embodiment according to the present invention will be described with reference to the drawings.

Figure 5:
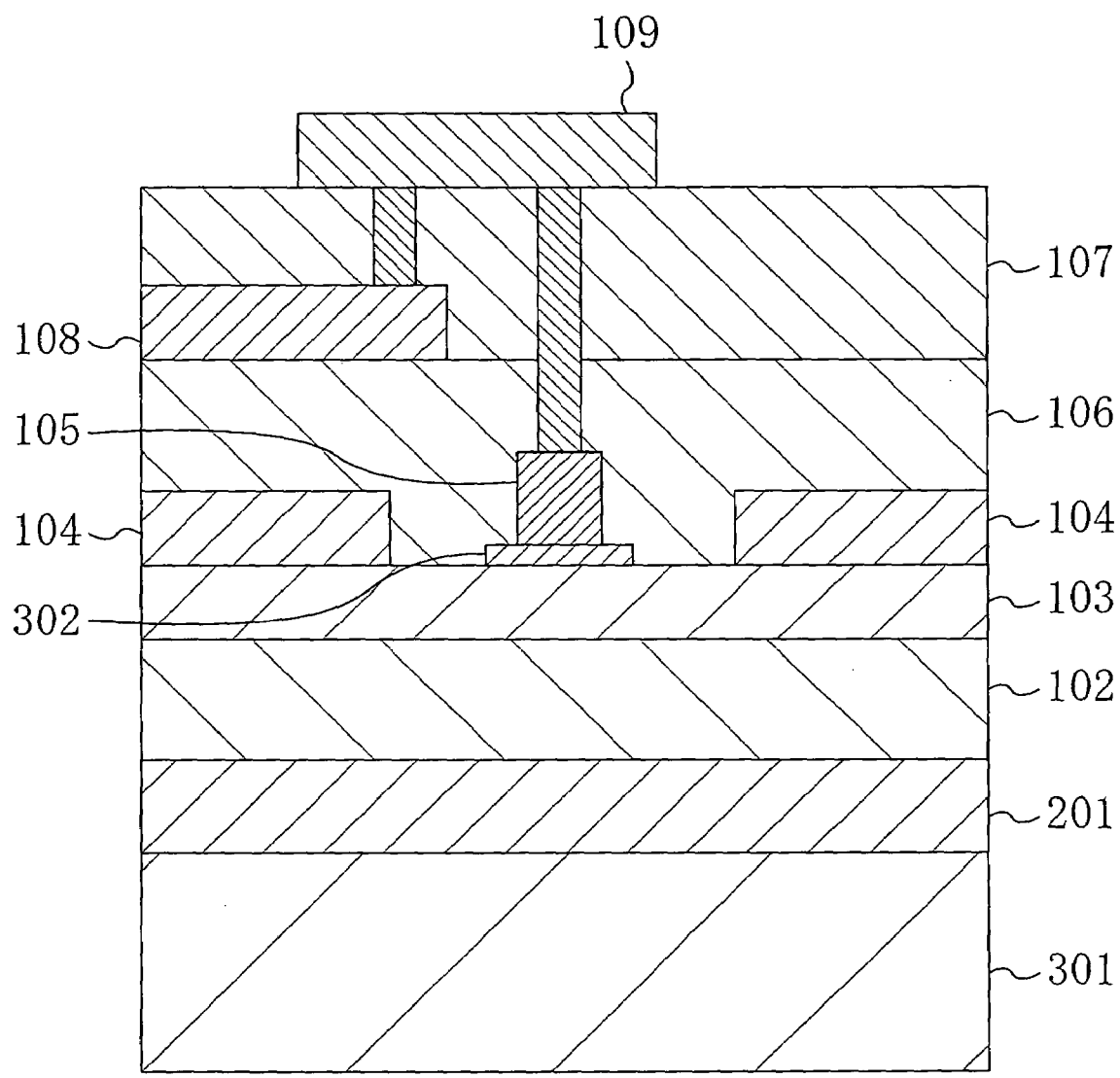
FIG. 5 is a sectional block diagram which depicts a switching semiconductor device according to a second modification of the first embodiment of the present invention.

FIG. 5 depicts a sectional configuration of a switching semiconductor device according to the second modification of the first embodiment of the present invention. In FIG. 5, the same constituent elements as those shown in FIG. 3 are denoted by the same reference numerals, and will not be described herein.

As shown in FIG. 5, the second modification differs from the first modification in the following respects. Sapphire is used for a single crystal substrate 301. A gate insulating film 302 which consists of, for example, gallium oxide ($Ga_2O_3$) and which has a thickness of about 10 nm is formed between a second compound layer 103 and a gate electrode 105, whereby the switching semiconductor device is formed as a so-called MIS FET (Metal Insulator Semiconductor FET). A material for the gate insulating film 302 is not limited to gallium oxide and aluminum oxide or aluminum nitride may be used as the material for the gate insulating film 302.

As can be understood, since the switching semiconductor device according to the second modification is a MIS type semiconductor device, a breakdown voltage of the device can be further increased. Therefore, if this switching semiconductor device is used in a switching circuit, it is possible to cause a high-amplitude, high-frequency signal to pass, through the switching circuit.

Embodiment 2

A second embodiment of the present invention will be described with reference to the drawings.

Figure 6A:
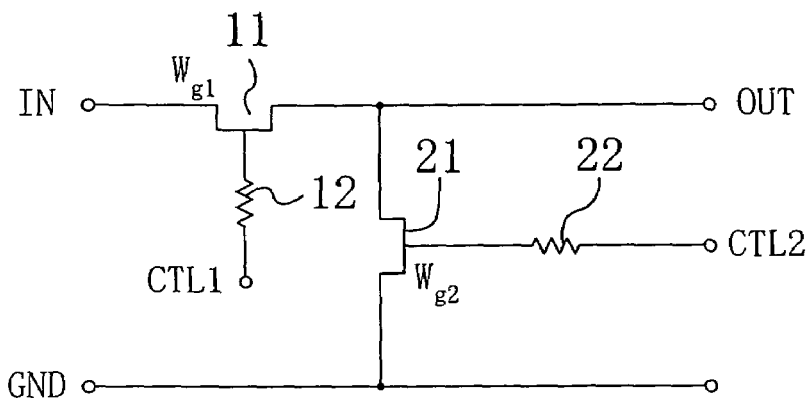

FIG. 6A depicts a circuit configuration of a switching circuit according to the second embodiment of the present invention. The switching circuit shown in FIG. 6A is constituted by combining a pair of switching semiconductor devices according to one of the first embodiment and the first and the second modifications of the first embodiment. The switching circuit is composed of a first FET 11 which is connected in series between an input terminal IN and an output terminal OUT, and a second FET 21 which is shunt-connected to the first FET 11. A first resistor 12 is connected in series between a gate of the first FET 11 having a gate width of $W_{g1}$ and a first control terminal CTL1. A second resistor 22 is connected in series between a gate of the second FET 21 having a gate width of $W_{g2}$ and a second control terminal CTL2.

Figure 6B:
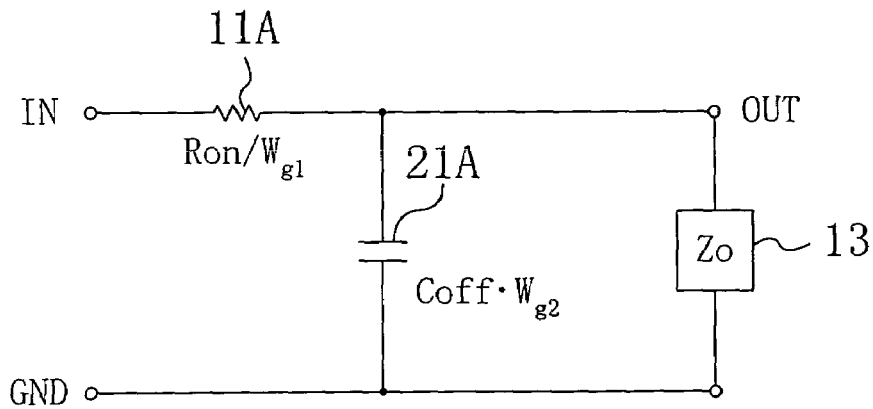

FIG. 6B is an equivalent circuit if the first FET 11 is in an ON state and the second FET 21 is in an OFF state. As shown in FIG. 6B, the equivalent circuit is expressed as an RC circuit composed of an ON resistance ($R_{on}/W_{g1}$) and an OFF capacitance ($C_{off} \cdot W_{g2}$). In FIG. 6B, a characteristic impedance 13 is $Z_0$ and an operating frequency is denoted by f. If the gate width $W_{g2}$ of the second FET 21 is excessively large, a high-frequency signal which is an input signal flows into an equivalent capacitance 21A of the second FET 21, and is not output.

Considering this, the gate width $W_{g2}$ of the gate of the second FET 21 is set to be equal or smaller than $1/(2\pi \cdot f \cdot C_{off} \cdot Z_0)$, whereby it is possible to prevent an output signal from flowing into the equivalent capacitance 21A of the second FET 21 shunt-connected to the first FET 11.

On the other hand, the first FET 11 in the ON state is denoted by an equivalent resistance 11A. If the gate width $W_{g1}$ of the gate of the first FET 11 is made excessively small, a maximum power determined by a breakdown voltage $V_b$ is higher than that determined by a maximum current $I_{max}$ of the first FET 11. To prevent this, the gate width $W_{g1}$ of the gate of the first FET 11 is set to be equal to or larger than $V_b/(I_{max} \cdot Z_0)$.

Namely, the gate width $W_{g1}$ is set to fall within a range represented by the following expression (1).

$$V_b/(I_{max} \cdot Z_0) \leq W_{g1}, W_{g2} \leq 1/(2\pi \cdot f \cdot C_{off} \cdot Z_0) \quad (1)$$

As a result, the gate widths $W_{g1}$ and $W_{g2}$ of the respective FET 11 and FET 21 are set at appropriate values, so that the input high-frequency signal can be effectively transmitted.

Further, the switching circuit according to the second embodiment employs any of switching semiconductor devices (HFETs) according to the first embodiment and the first and the second modifications of the first embodiment. Therefore, the GaN-based compound and the substrate material are lower in dielectric constant than the GaAs-based compound, and the OFF capacitance $C_{off}$ of the switching circuit can be reduced, accordingly. As a consequence, the switching circuit can exhibit both the low loss characteristic and the high isolation characteristic.

Modification of Embodiment 2

One modification of the second embodiment of the present invention will be described with reference to the drawings.

Figure 7:
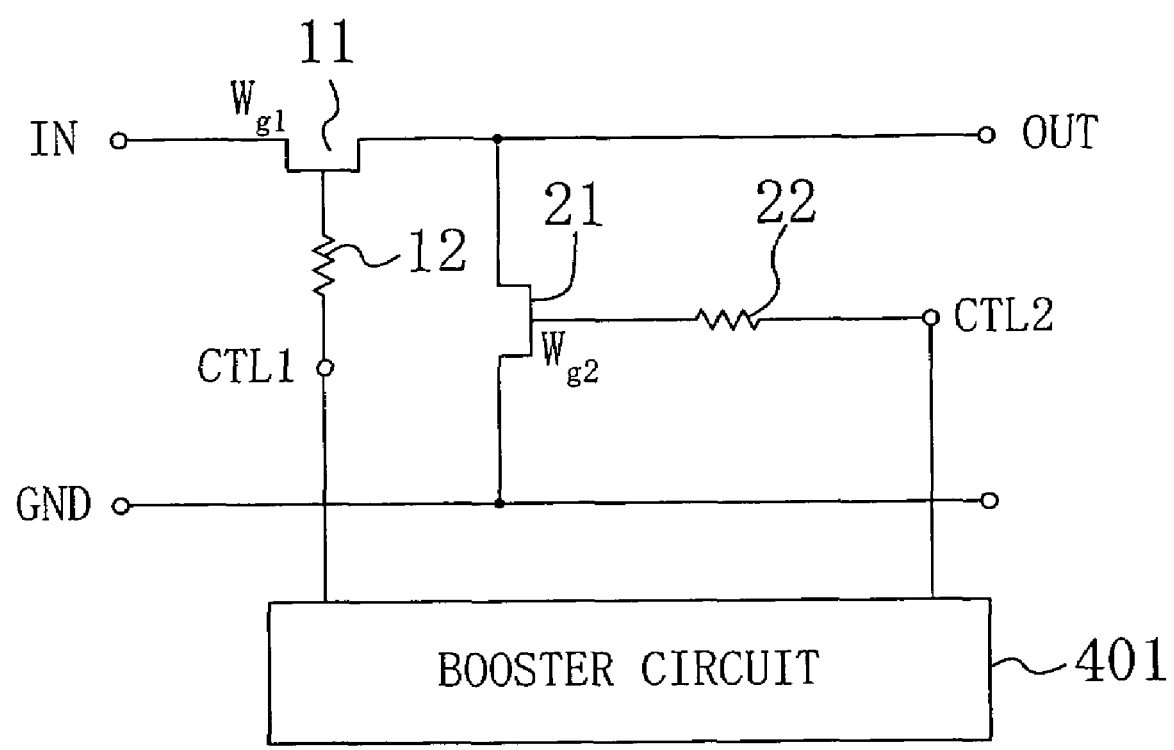
FIG. 7 is a circuit diagram which depicts a switching circuit according to one modification of the second embodiment of the present invention.

FIG. 7 depicts a circuit configuration of a switching circuit according to one modification of the second embodiment of the present invention. As shown in FIG. 7, the switching circuit according to one modification of the second embodiment of the present invention includes a booster circuit 401 which applies a boosted voltage, which is boosted to be higher than, for example, a power supply voltage, to a first control terminal CTL1 and a second control terminal CTL2.

As can be seen, according to this modification, the booster circuit 401 which applies the boosted voltage to the respective control terminals CTL1 and CTL2 is additionally provided. Therefore, even if the gate electrode of each of the first FET 11 and the second FET 21 is a single gate, or even if the number of connected FETs is small and the FETs are not constituted to have so-called multistage configuration, a high-amplitude, high-frequency signal can be caused to pass through the switching circuit.

The booster circuit 401 is not always provided in the switching circuit for the following reason. The switching circuit which employs conventional GaAs-based HFETs is low in breakdown voltage. Due to this, the switching circuit is designed so that the voltage applied to each transistor is equal to or lower than the breakdown voltage by connecting sources and drains of a plurality of HFETs in series. The breakdown voltage of the GaN-based HFET according to the present invention is, by contrast, quite high, i.e., equal to or higher than 100 V. Therefore, it is unnecessary to connect a plurality of FETs at multiple stages, and each FET can be constituted to have single-gate configuration, accordingly. It is thereby possible to considerably reduce a chip area of an integrated circuit.

Embodiment 3

A third embodiment of the present invention will be described with reference to the drawings.

Figure 8A:
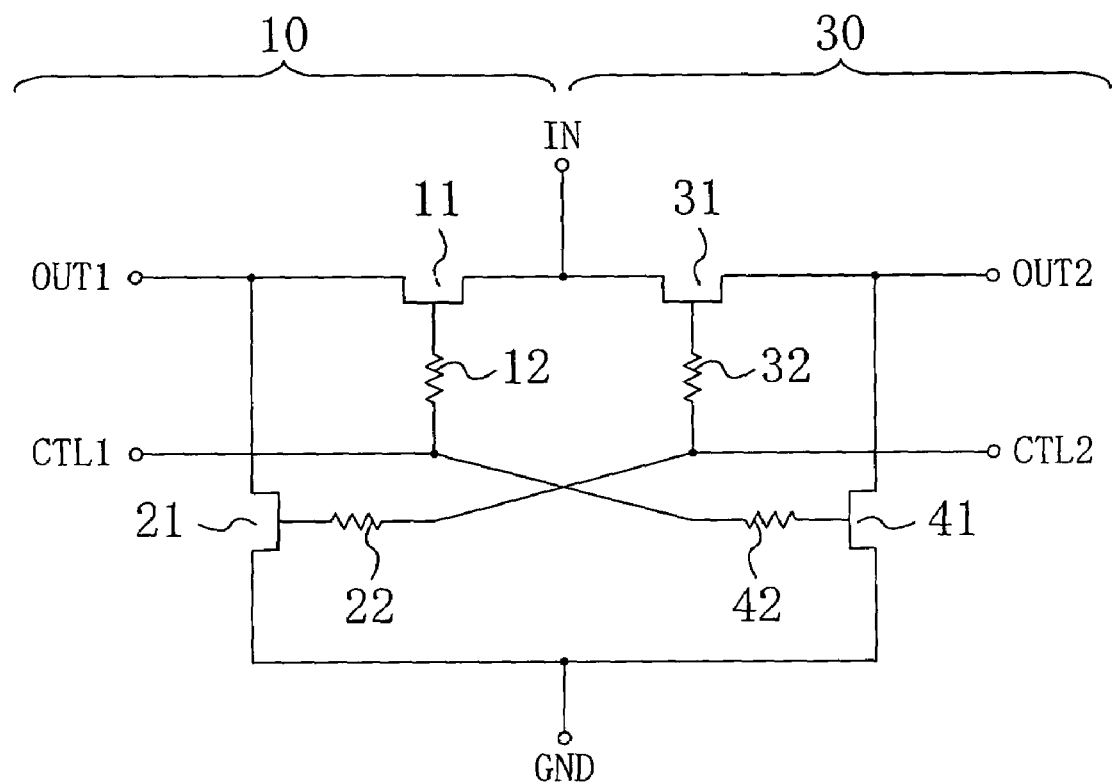

FIG. 8A depicts a circuit configuration of a switching circuit according to the third embodiment of the present invention. The switching circuit shown in FIG. 8A is constituted by combining a pair of switching circuits according to the second embodiment, thereby constituting a so-called SPDT type switching circuit.

Namely, the switching circuit according to the third embodiment includes a first switching circuit 10 which is composed of a first FET 11 connected in series between an input terminal IN and a first output terminal OUT1, and a second FET 21 shunt-connected to the first FET 11, and a second switching circuit 30 which is composed of a third FET 31 connected in series between the input terminal IN and a second output terminal OUT2, and a fourth FET 41 shunt-connected to the third FET 31.

A first resistor 12 is connected in series between a gate of the first FET 11 having a gate width of $W_{g1}$ and a first control terminal CTL1, and a second resistor 22 is connected in series between a gate of the second FET 21 having a gate width of $W_{g2}$ and a second control terminal CTL2.

Likewise, a third resistor 32 is connected in series between a gate of the third FET 31 having a gate width of $W_{g3}$ and the second control terminal CTL2, and a fourth resistor 42 is connected in series between a gate of the fourth FET 41 having a gate width of $W_{g4}$ and the first control terminal CTL1.

The SPDT switching circuit is the most fundamental switching circuit employed in a mobile communication field. An output destination of a high-frequency signal input from the input terminal IN can be switched over between the first output terminal OUT1 and the second output terminal OUT2 by setting voltages applied to the first control terminal CTL1 and the second control terminal CTL2 at appropriate values, respectively.

Figure 8B:
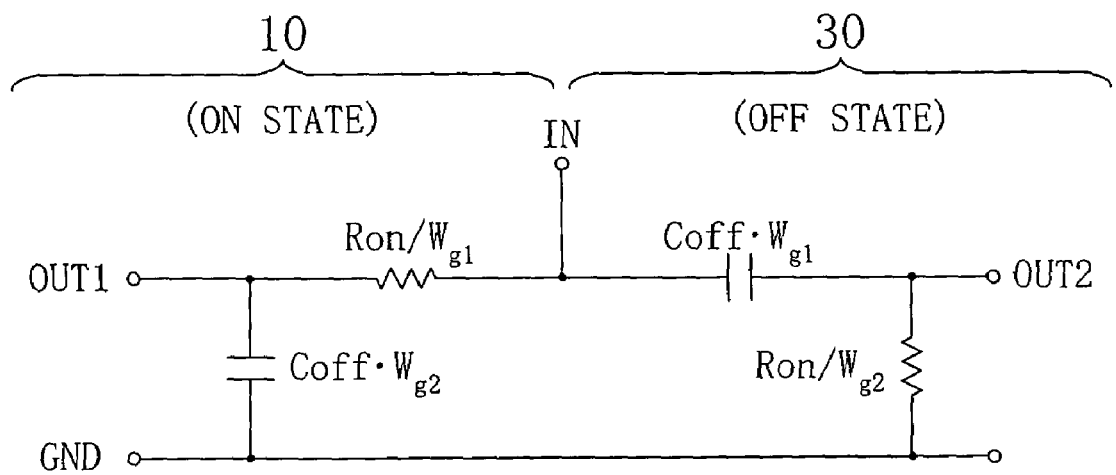

FIG. 8B depicts an equivalent circuit when a voltage level of the first control terminal CTL1 is at a high potential and that of the second control terminal CTL2 is at a low potential. Namely, the first switching circuit 10 is in an ON state and the second switching circuit 30 is in an OFF state. In this case, therefore, the input high-frequency signal is output to the first output terminal OUT1. In FIG. 8B, symbol $R_{on}$ denotes an ON resistance per unit gate width while each of the FETs 11 and 41 is in the ON state. Symbol $C_{off}$ denotes an OFF capacitance while each of the FETs 21 and 31 is in the OFF state.

Generally, the ON resistance $R_{on}$ of the GaN-based HFET is 3 to 4 Ω mm, which is higher than that of the GaAs-based HFET. Due to this, if the GaN-based FETs are applied to the switching circuit, this high ON resistance is a disadvantage.

As a result of various studies and considerations, the inventors of the present application discovered that this high ON resistance is mainly due to the fact that a contact resistance of an ohmic electrode is as high as $1 \times 10^{-5}$ Ω cm$^2$.

A manufacturing method intended to reduce the ohmic electrode in each of the FETs that constitute the SPDT switch circuit will be described with reference to the drawings.

Figure 9A:
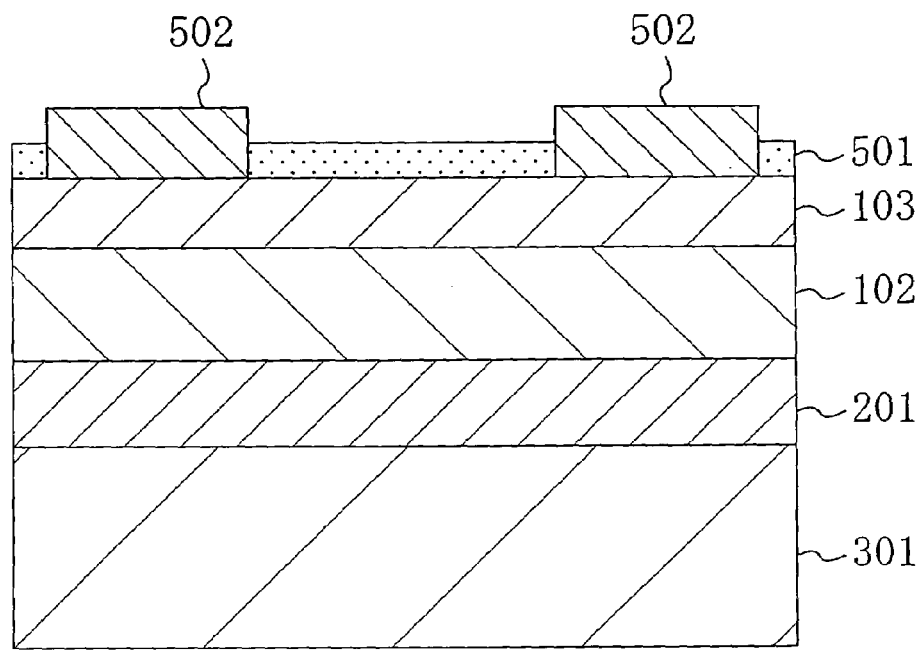
FIGS. 9A and 9B depict sectional configurations of a switching semiconductor device that constitutes the switching circuit according to the third embodiment of the present invention in an order of steps of a method for manufacturing ohmic electrodes of the switching semiconductor device.
Figure 9B:
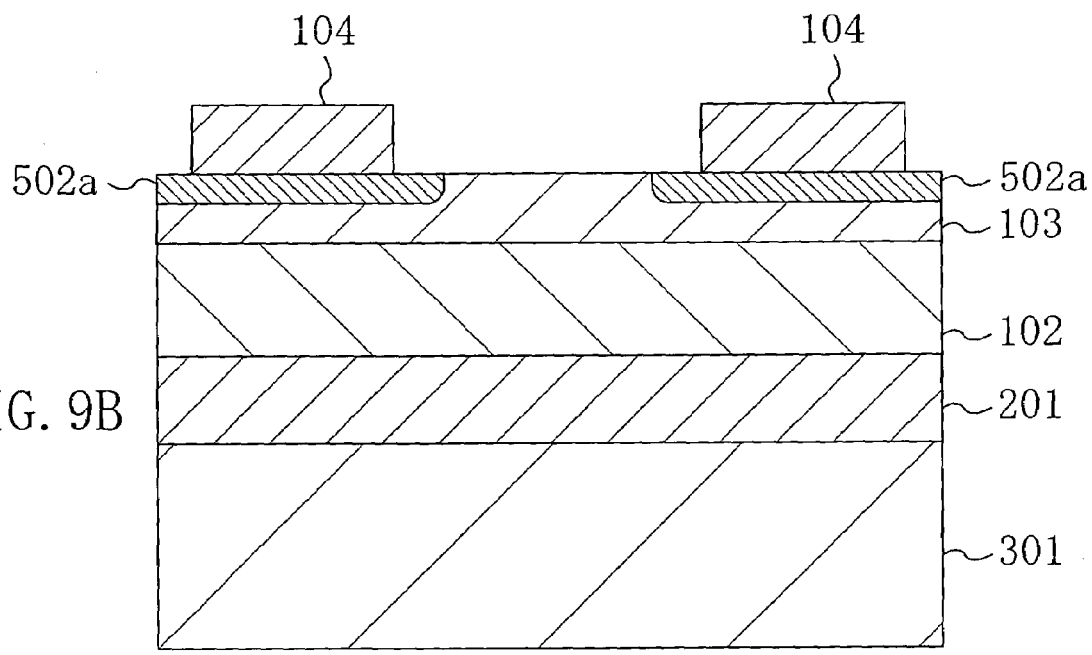

FIGS. 9A and 9B depict sectional configurations of the switching semiconductor device (HFET) that constitutes the switching circuit according to the third embodiment of the present invention in the order of steps of a method for manufacturing ohmic electrodes of the HFET. The switching semiconductor device shown in FIG. 5 will be taken herein as an example. The same constituent elements as those shown in FIG. 5 are denoted by the same reference numerals, respectively, and will not be described herein.

First, as shown in FIG. 9A, a third compound layer 201 which consists of AlN, a first compound layer 102 which consists of GaN, and a second compound layer 103 which consists of AlGaN are epitaxially grown on a single crystal substrate 301 which consists of sapphire by, for example, a metal organic vapor phase epitaxy (MOVPE) method. Thereafter, a mask film 501 which consists of silicon oxide is formed on the second compound layer 103 by, for example, a chemical vapor deposition (CVD) method. An opening which selectively exposes the second compound layer 103 to an ohmic electrode formation region on the mask film 501 is formed by lithography and dry etching. A dopant 502 which consists of silicon (Si) is formed in the formed opening so as to be filled into the opening by, for example, an evaporation method. In this state, annealing is performed for about 40 minutes at a temperature of about 1000° C. in a nitrogen atmosphere.

Next, the mask film 501 and the dopant 502 are removed, and then a resist pattern (not shown) for opening the ohmic electrode formation region is formed by lithography. Titanium and aluminum for ohmic electrode formation are sequentially deposited on the resist pattern thus formed by, for example, the evaporation method. Thereafter, the resist pattern is lifted off, thereby forming ohmic electrodes 104 as shown in FIG. 9B. At this time, an n-type doped region 502a obtained by solid-diffusing silicon (Si) from the dopant 502 is formed in a region below each ohmic electrode 104 in the second compound layer 103 by annealing in the nitrogen atmosphere.

If the mask film 501 which consists of silicon oxide is removed by dry etching, a fluorocarbon-based etching gas is used. If the dopant which consists of silicon is removed, an etching gas containing chlorine or bromine is used.

Figure 10:
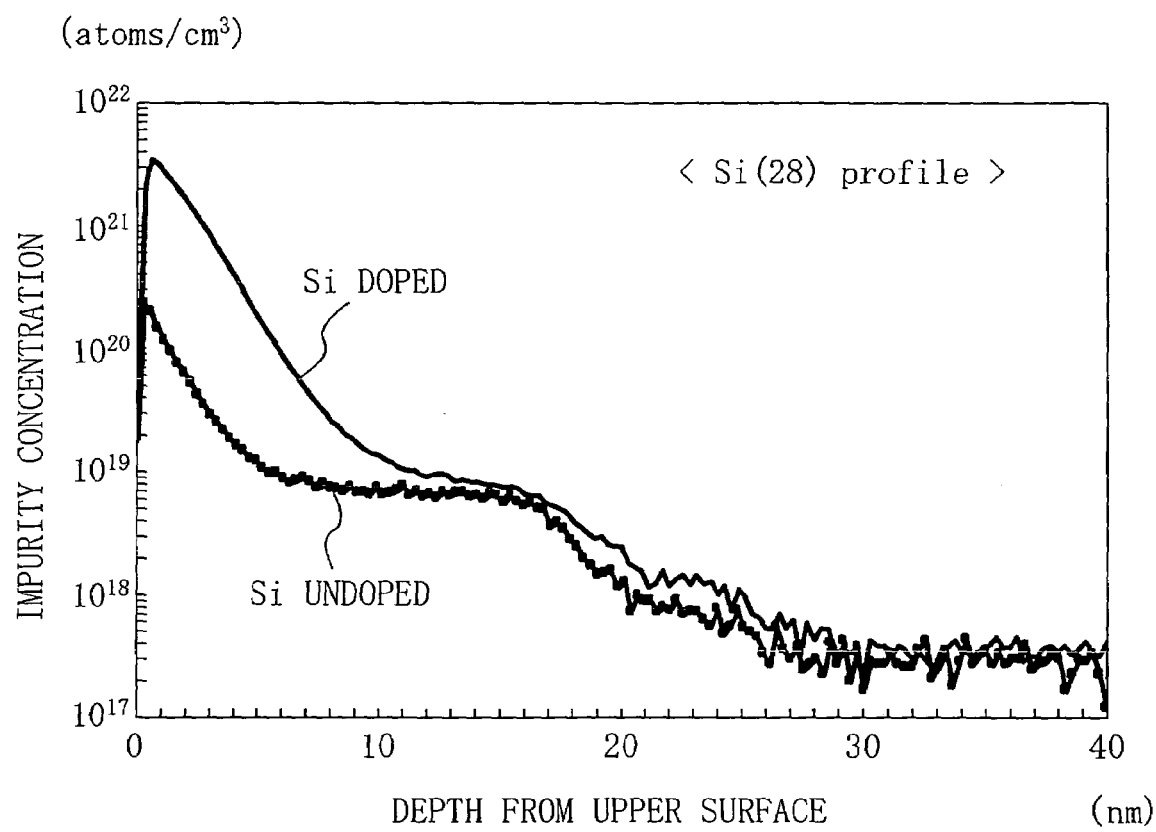
FIG. 10 is a graph which depicts impurity concentration profiles when an AlGaN layer is doped with silicon and undoped with silicon, respectively in the switching semiconductor device that constitutes the switching circuit according to the third embodiment of the present invention.

FIG. 10 depicts impurity concentration profiles when the second compound layer 103 is doped with silicon and undoped with silicon, respectively. To obtain the profiles, a secondary ion mass spectroscopy (SIMS) method is used. As shown in FIG. 10, a silicon concentration in the second compound layer 103 is increased from $2 \times 10^{20}$ cm$^{-3}$ to $3 \times 10^{21}$ cm$^{-3}$ near the upper surface by doping the second compound layer 103 with silicon. The silicon (Si) having the silicon concentration of $2 \times 10^{20}$ cm$^{-3}$ is doped into the second compound layer 103 during epitaxial growth.

Figure 11:
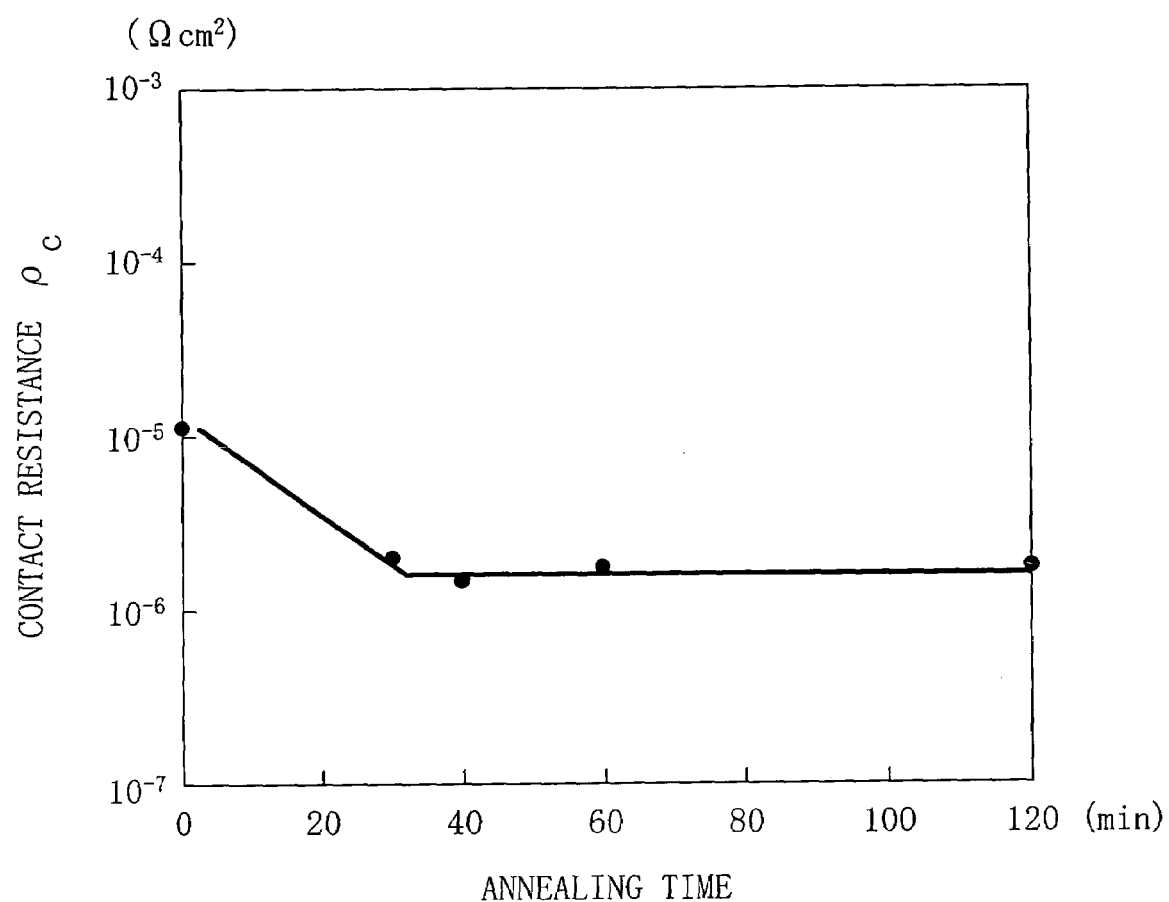
FIG. 11 is a graph which depicts dependency of a contact resistance of an ohmic electrode of the switching semiconductor device that constitutes the switching circuit according to the third embodiment of the present invention, on annealing time (doping time).

FIG. 11 depicts dependency of a contact resistance $\rho_c$ on annealing time (doping time). As shown in FIG. 11, the contact resistance $\rho_c$ can be reduced by about one figure from $1 \times 10^{-5}$ Ω cm$^2$, at which silicon is not doped, to $1.2 \times 10^{-6}$ Ω cm$^2$.

Next, in the third embodiment, a distance $L_{sd}$ between the drain and the source of the switching semiconductor device is shortened so as to further reduce the ON resistance $R_{on}$.

Figure 12:
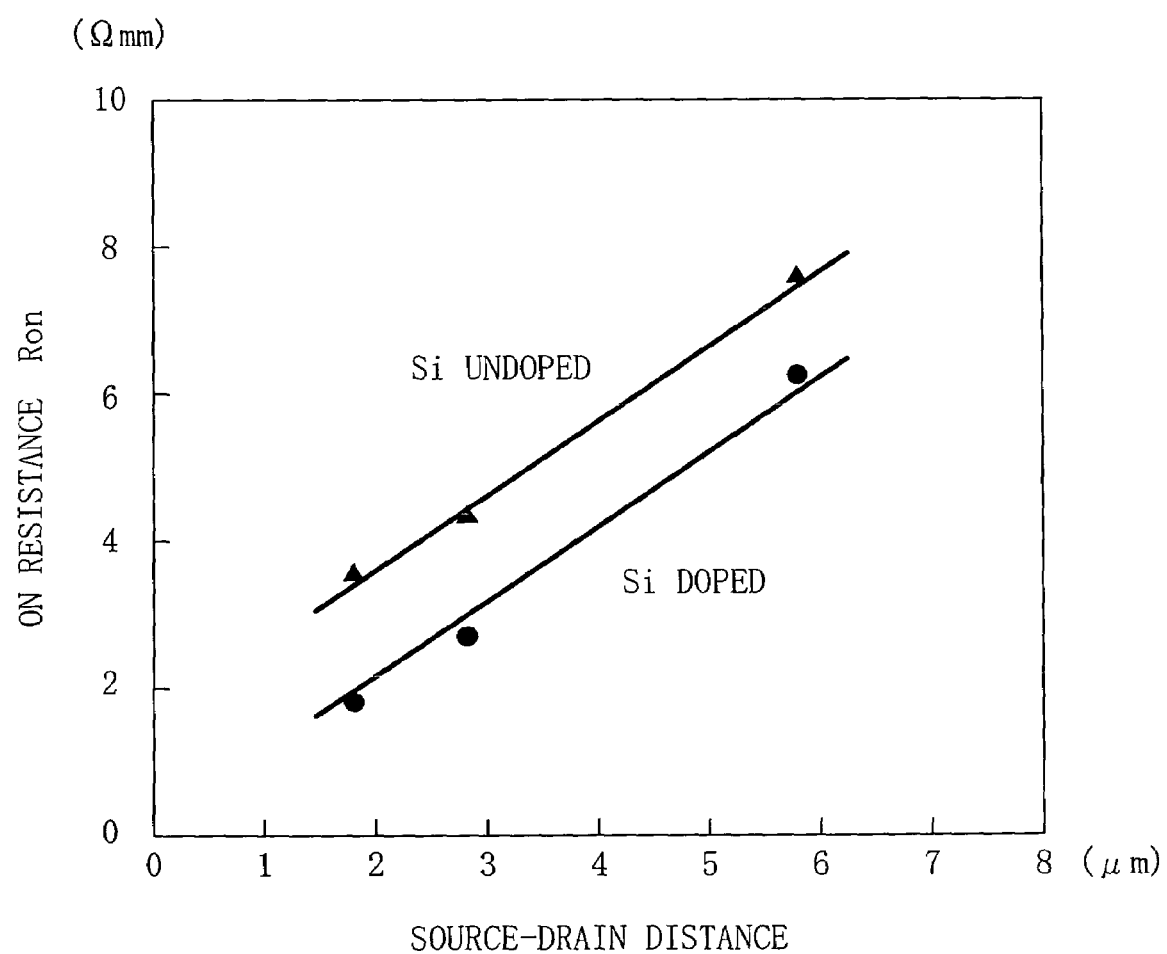
FIG. 12 is a graph which depicts dependency of an ON resistance of the switching semiconductor device that constitutes the switching circuit according to the third embodiment of the present invention, on a drain-source distance.

FIG. 12 depicts dependency of the ON resistance $R_{on}$ on the drain-source distance $L_{sd}$. As can be seen from FIG. 12, if silicon is doped, the ON resistance $R_{on}$ can be reduced by about 50% as compared with the instance in which silicon is undoped.

A switching semiconductor device (HFET) having the ON resistance $R_{on}$ of 1.86 Ω mm and the OFF capacitance $C_{off}$ of 0.35 pF/mm is manufactured. The gate width $W_{g1}$ of the first FET 11 and the gate width $W_{g2}$ of the second FET 21 at which the insertion loss is minimized are inspected from the equivalent circuit shown in FIG. 8B using a circuit simulator. The inspection result will be shown.

Figure 13A:
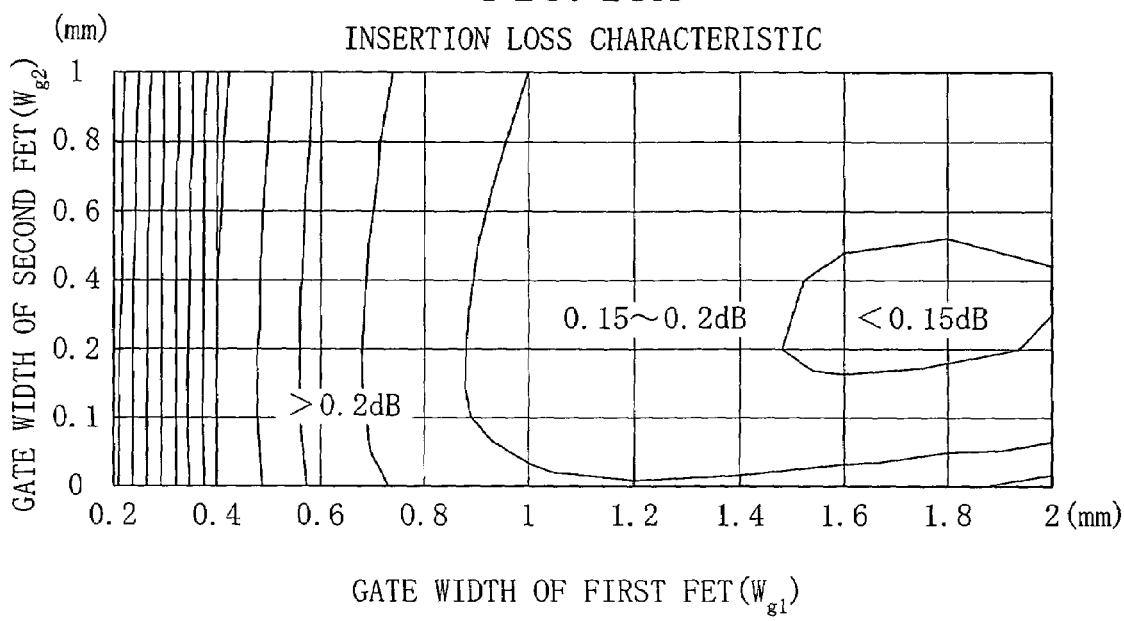
Figure 13B:
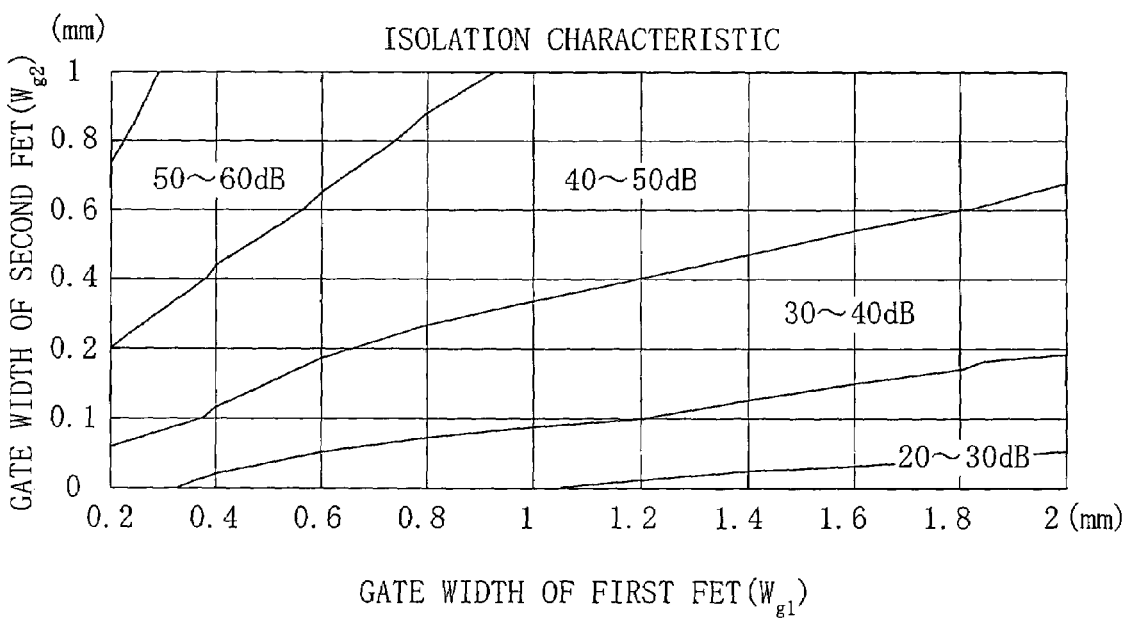

FIG. 13A depicts dependency of the insertion loss characteristic on the gate widths $W_{g1}$ and $W_{g2}$ at an operating frequency of 1 GHz. FIG. 13B depicts dependency of the isolation characteristic on the gate widths $W_{g1}$ and $W_{g2}$ at the operating frequency of 1 GHz. As can be seen from FIG. 13A, the gate widths $W_{g1}$ and $W_{g2}$ at which the insertion loss is minimized to 0.15 dB or less are about 1.5 mm to 2 mm and about 0.16 mm to 0.5 mm, respectively. The insertion loss is sufficiently low.

On the other hand, as can be seen from FIG. 13B, with a combination of the gate widths $W_{g1}$ and $W_{g2}$ at which the insertion loss is minimized, the isolation is 30 dB or less, which is sufficiently satisfactory value.

Besides, each FET according to the third embodiment has a one-stage configuration, so that a chip size can be reduced to 40% of the switching circuit using the GaAs-based compound.

The first switching circuit 10 has been described so far. However, the same configuration can be applied to the second switching circuit 30 because of circuit symmetry.

The high-frequency characteristics of the SPDT type switching circuit constituted by using the FETs manufactured as stated above will next be described. In this embodiment, the high-frequency characteristics of the switching circuit are obtained using a high-frequency probe which has a measurement frequency at 1 GHz on wafer.

Figure 14:
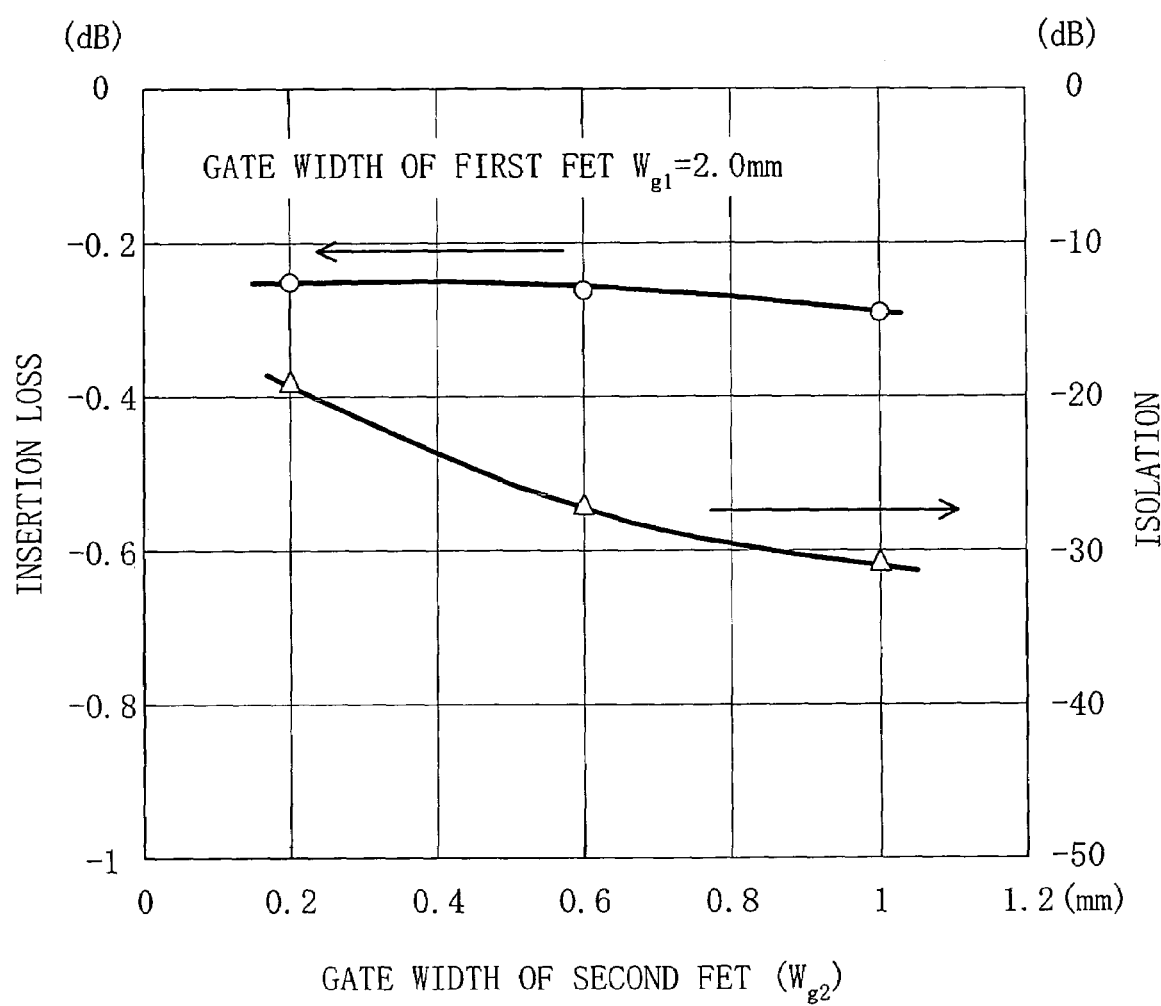
FIG. 14 is a graph which depicts dependency of the insertion loss characteristic of the switching semiconductor device that constitutes the switching circuit according to the third embodiment of the present invention and that is shunt-connected, on the gate width.

FIG. 14 depicts dependency of the insertion loss characteristic and the isolation characteristic on the gate width $W_{g2}$ of the second FET 21. As can be seen from FIG. 14, the isolation characteristic can be considerably improved while hardly sacrificing the insertion loss by setting the gate width $W_{g2}$ large. This tendency coincides with the above-stated simulation result. That is, if the gate widths $W_{g1}$ and $W_{g2}$ are set at 2.0 mm and 0.6 mm, respectively, then the insertion loss is 0.26 dB and the isolation is 27 dB. These values are equivalent to those of the switching circuit composed of the GaAs-based HFETs.

Input and output characteristics of the SPDT type switching circuit thus manufactured will be described.

Figure 15:
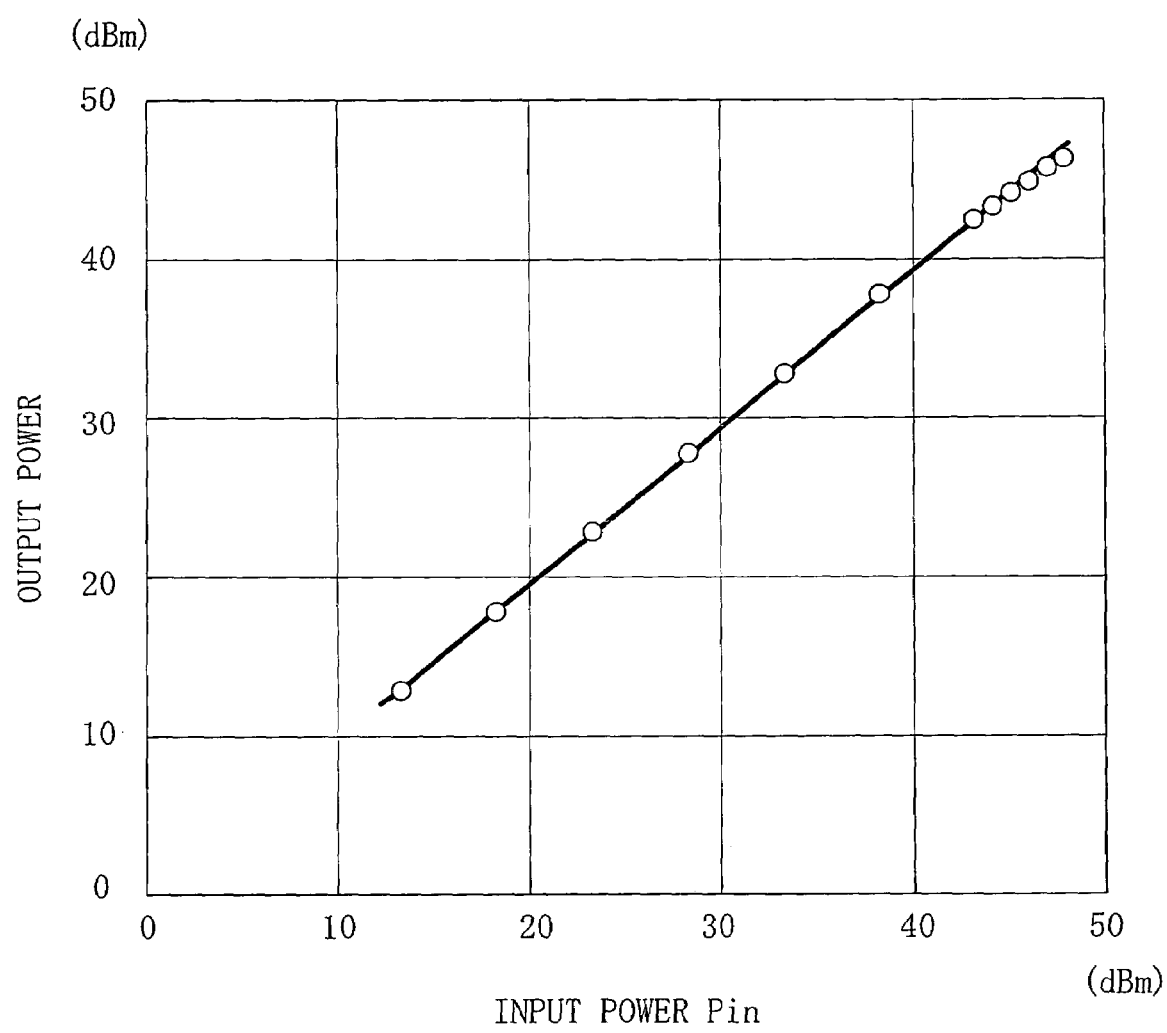
FIG. 15 is a graph which depicts an input and output characteristic of the switching circuit according to the third embodiment of the present invention.

As shown in FIG. 15, if control voltages $V_c$ applied to the first control terminal CLT1 and the second control terminal CLT2 are set at 22 V and 0 V, respectively, then a switchable signal power reaches about 43 W, so that a high-frequency signal with extremely high input power can be switched.

This value is about ten times as high as that of a typical GaAs-based switching circuit.

Figure 16:
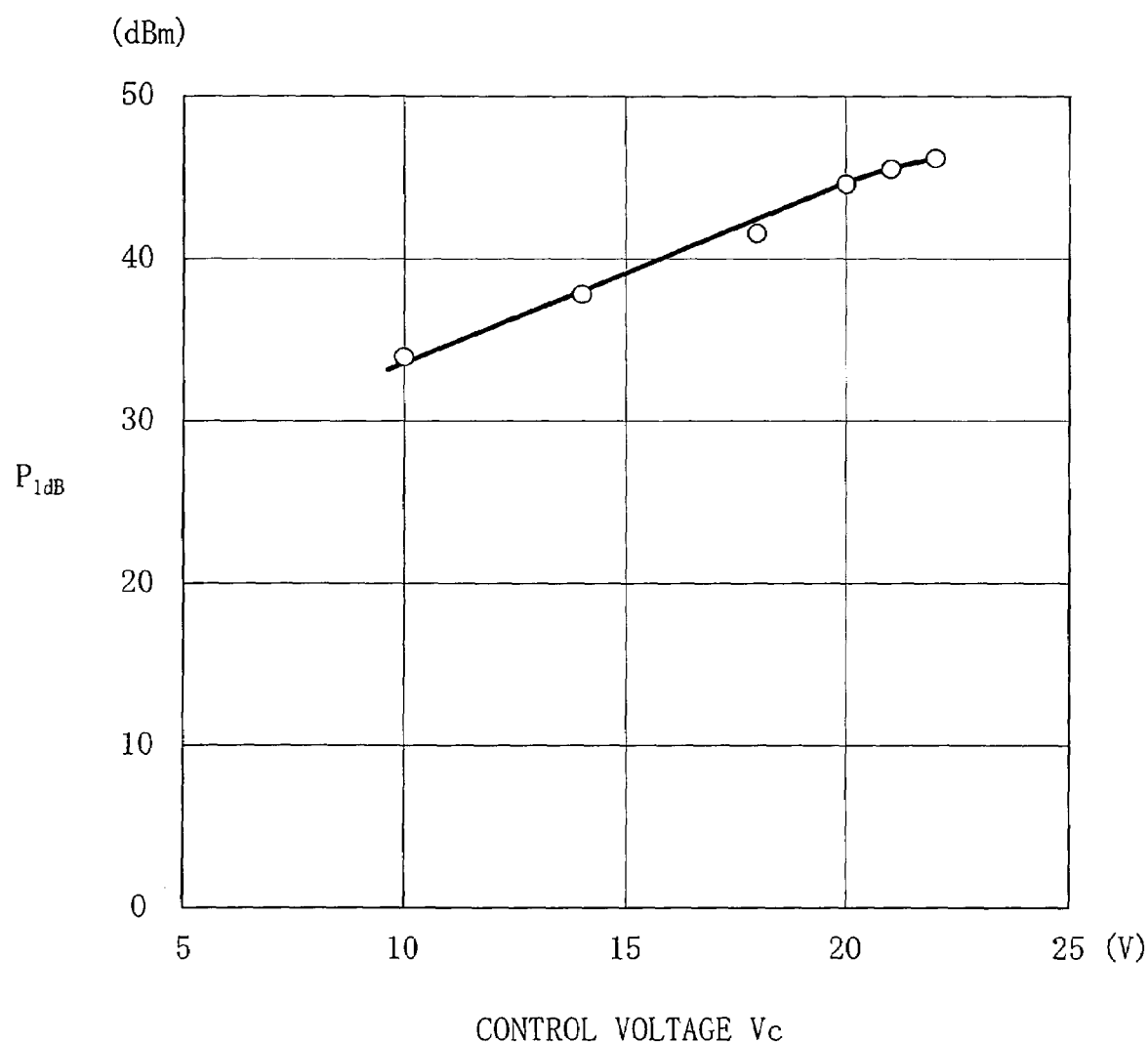
FIG. 16 is a graph which depicts dependency of $P_{1\,dB}$ on a control voltage in the switching circuit according to the third embodiment of the present invention.
Figure 17:
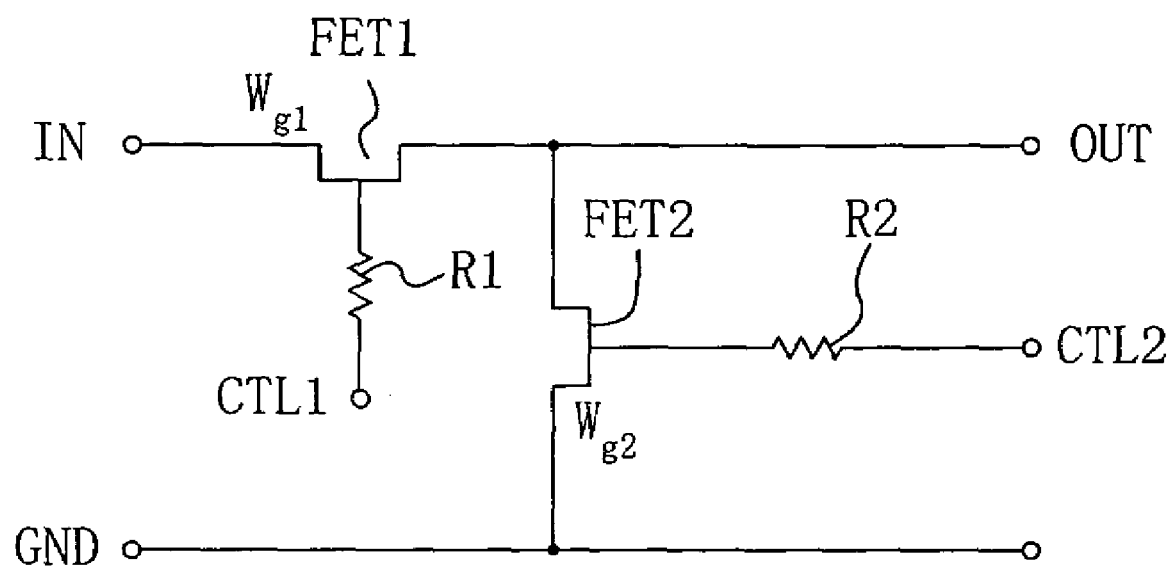
FIG. 17 is a circuit diagram which depicts a conventional high-frequency switching circuit.

FIG. 16 depicts dependency on control voltage of a 1 dB compression point $P_{1\,dB}$ which represents a switchable RF signal power and which is generally referred to as "peak one dB" on the control voltage. As shown in FIG. 14, the higher the control voltage $V_c$ is, the higher the 1 dB $P_{1\,dB}$ is. If the control voltage $V_c$ is 22V, the $P_{1\,dB}$ reaches about 43 W. This indicates that the $P_{1\,dB}$ is restricted by a threshold voltage $V_{th}$ of the HFET. To realize the $P_{1\,dB}$ at this level in the conventional GaAs-based switching circuit, the multistage circuit configuration is required, which not only increases the chip size but also deteriorates the insertion loss characteristic.

The switching semiconductor device and the switching circuit according to the present invention can realize both the reduction of the OFF capacitance of the field effect transistor and the ON resistance thereof that constitutes the switching semiconductor device or the switching circuit. Furthermore, since each gate width can be set at an appropriate value, it is advantageously possible to reduce the insertion loss and improve the isolation characteristic. Therefore, the switching semiconductor device and the switching circuit according to the present invention are effective for a high-frequency communication apparatus such as a cellular telephone, and the like.

What is claimed is:

1. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer; and
   a resistor connected to said gate electrode,
   wherein a control voltage is applied to said gate electrode through said resistor.

2. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer;
   a resistor connected to said gate electrode; and
   a third compound layer formed between said substrate and said first compound layer, and consisting of a general formula $Al_uGa_{1-u}N$, where $0 < u \leq 1$.

3. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer; and
   a resistor connected to said gate electrode,
   wherein said substrate consists of silicon carbide, sapphire, silicon, or aluminum nitride.

4. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer;
   a resistor connected to said gate electrode; and
   an ohmic electrode formed on said second compound layer,
   wherein a region of said second compound layer below said ohmic electrode is doped with n-type impurities.

5. The switching semiconductor device of claim 4, wherein
   said n-type impurities are silicon impurities.

6. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer;
   a resistor connected to said gate electrode; and
   an ohmic electrode formed on said second compound layer,
   wherein an interface between said second compound layer and said ohmic electrode and neighborhoods of the interface are doped with n-type impurities.

7. The switching semiconductor device of claim 6, wherein
   said n-type impurities are silicon impurities.

8. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer; and
   a resistor connected to said gate electrode,
   wherein if it is assumed that a gate width of said gate electrode is $W_g$, a drain-source capacitance per unit gate width of said gate electrode during channel cutoff is $C_{off}$, a maximum drain current per unit gate width is $I_{max}$, a breakdown voltage is $V_b$, a characteristic impedance of a system is $Z_0$, and an operating frequency is f, the gate width $W_g$ satisfies a relationship represented by:

$$V_b/(I_{max} \cdot Z_0) \leq W_g \leq 1/(2\pi \cdot f \cdot C_{off} \cdot Z_0).$$

9. A switching semiconductor device, comprising:
   a first compound layer formed on a substrate, and consisting of a general formula $In_xGa_{1-x}N$, where $0 \leq x \leq 1$;
   a second compound layer formed on said first compound layer, and consisting of a general formula $In_yAl_zGa_{1-y-z}N$, where $0 \leq y \leq 1$ and $0 < z \leq 1$;
   a gate electrode formed on said second compound layer; and
   a resistor connected to said gate electrode,
   wherein said gate electrode is composed of a single gate electrode, and
   the switching semiconductor device further comprises a booster circuit which applies a boosted voltage, obtained by boosting a power supply voltage, to said gate electrode.

10. A switching semiconductor device, comprising:
    a first compound layer formed on a substrate, and consisting of a general formula $In_xGa_{1-x}N$, where $0 \leq x \leq 1$;
    a second compound layer formed on said first compound layer, and consisting of a general formula $In_yAl_zGa_{1-y-z}N$, where $0 \leq y \leq 1$ and $0 < z \leq 1$;
    a gate electrode formed on said second compound layer; and a resistor connected to said gate electrode, wherein a gate insulating film is formed between said gate electrode and said second compound layer.

11. The switching semiconductor device of claim 10, wherein said gate insulating film consists of gallium oxide, aluminum oxide, or aluminum nitride.

12. A switching circuit comprising:

a first transistor connected in series between an input terminal and an output terminal; and a second transistor shunt-connected to said first transistor, wherein said first transistor and said second transistor are formed on a same substrate, each of said first transistor and said second transistor comprises:

a first compound layer formed on a substrate, and consisting of a general formula $In_xGa_{1-x}N$, where $0 \leq x \leq 1$;

a second compound layer formed on said first compound layer, and consisting of a general formula $In_yAl_zGa_{1-y-z}N$, where $0 \leq y \leq 1$ and $0 < z \leq 1$;

a gate electrode formed on said second compound layer; and a resistor connected to said gate electrode.

13. The switching circuit of claim 12, further comprising:

a first switching circuit and a second switching circuit including said first transistor and said second transistor, respectively, wherein said first transistor in said first switching circuit and said first transistor in said second switching circuit are connected in series.

14. The switching circuit of claim 12, further comprising:

a third compound layer formed between said substrate and each said first compound layer, and consisting of a general formula $Al_uGa_{1-u}N$, where $0 < u \leq 1$.

15. The switching circuit of claim 12, wherein said substrate consists of silicon carbide, sapphire, silicon, or aluminum nitride.

16. The switching circuit of claim 12, wherein each of said first transistor and said second transistor comprises an ohmic electrode formed on said second compound layer, and a region of said second compound layer below said ohmic electrode is doped with n-type impurities.

17. The switching circuit of claim 16, wherein said n-type impurities are silicon impurities.

18. The switching circuit of claim 12, wherein each of said first transistor and said second transistor comprises an ohmic electrode formed on said second compound layer, and an interface between said second compound layer and said ohmic electrode and neighborhoods of the interface are doped with n-type impurities.

19. The switching circuit of claim 18, wherein said n-type impurities are silicon impurities.

20. The switching circuit of claim 12, wherein if it is assumed that a gate width of said gate electrode is $W_g$, a drain-source capacitance per unit gate width of said gate electrode during channel cutoff is $C_{off}$, a maximum drain current per unit gate width is $I_{max}$, a breakdown voltage is $V_b$, a characteristic impedance of a system is $Z_0$, and an operating frequency is f, the gate width $W_g$ satisfies a relationship represented by:

$$V_b/(I_{max} \cdot Z_0) \leq W_g \leq 1/(2\pi \cdot f \cdot C_{off} \cdot Z_0).$$

21. The switching circuit of claim 12, wherein a gate width of said gate electrode in said first transistor is larger than 1.0 mm and smaller than 3.0 mm, and a gate width of said gate electrode in said second transistor is larger than 0 mm and smaller than 2.0 mm.

22. The switching circuit of claim 12, wherein each said gate electrode is composed of a single gate electrode, and the switching circuit further comprises a booster circuit which applies a boosted voltage, obtained by boosting a power supply voltage, to each said gate electrode.

23. The switching circuit of claim 12, wherein a gate insulating film is formed between each said gate electrode and each said second compound layer.

24. The switching circuit of claim 23, wherein said gate insulating film consists of gallium oxide, aluminum oxide, or aluminum nitride.

* * * * *